(12) United States Patent
Dodson

(10) Patent No.: US 6,724,624 B1
(45) Date of Patent: Apr. 20, 2004

(54) HOUSING WITH DIRECTED-FLOW COOLING FOR COMPUTER

(76) Inventor: Douglas A. Dodson, 5995 Avenida Encinas, Carlsbad, CA (US) 92008

( * ) Notice: Subject to any disclaimer, the term of this patent is extended or adjusted under 35 U.S.C. 154(b) by 0 days.

(21) Appl. No.: 10/430,156

(22) Filed: May 5, 2003

(51) Int. Cl.[7] .................................................. H05K 7/20
(52) U.S. Cl. ...................... 361/695; 361/687; 361/688; 361/689; 361/690; 174/16.1; 174/16.3; 165/80.3; 165/122; 454/184
(58) Field of Search ................................ 361/687–695; 174/16.1, 16.3; 165/80.3, 122; 454/184

(56) References Cited

U.S. PATENT DOCUMENTS

| | | | | |
|---|---|---|---|---|
| 5,491,610 A | * | 2/1996 | Mok et al. ................... | 361/695 |
| 5,694,294 A | * | 12/1997 | Ohashi et al. ............... | 361/687 |
| 5,991,153 A | * | 11/1999 | Heady et al. ................ | 361/704 |
| 6,011,701 A | * | 1/2000 | Kopp et al. .................. | 361/818 |
| 6,226,182 B1 | * | 5/2001 | Maehara ...................... | 361/695 |
| 6,618,248 B1 | * | 9/2003 | Dalheimer ................... | 361/687 |

* cited by examiner

*Primary Examiner*—Boris Chervinsky
(74) *Attorney, Agent, or Firm*—Mary Jo Redman; Calif Tervo

(57) ABSTRACT

Housing with directed-flow cooling (10) for computer (110) provides auxiliary airflow for cooling a heat-sensitive component, such as CPU (120). Housing (10) includes partition (60) that separates housing (10) into a lower compartment (40) for enclosing computer (110) and an upper compartment (20) for receiving ambient air through slots (24). Partition (60) includes vent opening (61) above CPU (120) that allows air to flow from upper compartment onto CPU (120), directed by impingement fan (50).

12 Claims, 3 Drawing Sheets

US 6,724,624 B1

HOUSING WITH DIRECTED-FLOW COOLING FOR COMPUTER

FIELD OF THE INVENTION

This invention relates to a housing for a computer that enhances processor cooling by ambient air and more specifically to a partition, vent, and fan system that causes cooling air to impinge first upon the most heat-sensitive component of the computer.

BACKGROUND OF THE INVENTION

Low profile, rack mountable, electronic devices, such as computers and servers, contain heat-generating components that are particularly heat sensitive, that is, they operate poorly or fail to operate if they are above a certain temperature. The central processing unit (CPU) is typically one such device.

Most conventional CPUs are cooled by providing a flow path for air through the housing of the device and an internal fan for moving the air along the path and over the CPU. The air received by the CPU has typically already been heated by other components in the device, such that the cooling performance of the air on the CPU is somewhat dependent upon the heat generated by components upstream in the flow path. CPU operation may be adversely affected by adding heat-generating components upstream or by driving the upstream components to higher power consumption.

Typically, cooling air is drawn in through an air intake grille in the front of the housing and exhausted through an outlet in the back or side of the housing. Although it is preferable that the heat-sensitive components are located nearest the grille, it is not always possible. For example, it is often necessary to mount input-output devices, such as CD-ROM or tape drives, near the front of the housing so that they are accessible to the user. In some cases, the most heat-sensitive component may have to be mounted far from the air intake grille.

The problem is exacerbated is very low profile devices, such as rack mountable devices, where there is high density of components and limited space for cooling air flow path.

Therefore, there has been a need to provide improved cooling to an electronic device having a particularly heat-sensitive component, particularly to a low profile rack-mountable computer.

SUMMARY OF THE INVENTION

The present invention is a housing for a computer or similar electronic device with both heat-generating and heat-sensitive components, and for which the standard air cooling is not sufficient.

The housing is separated by a partition into a lower compartment, enclosing the electronic components, and an upper compartment for receiving cooling air for the heat-sensitive component, such as the CPU. The partition includes a vent that allows cool air to flow from the upper compartment and impinge upon the CPU without first passing over heat-generating components. A fan for moving the cooling air may be attached to the top of the CPU, such as by mounting onto the CPU heatsink.

The upper compartment includes air inlets for receiving ambient air. Typically, CPU cooling airflow joins the standard airflow from the front grille and exits the housing via an exhaust outlet near the rear of the housing. An additional advantage of providing air inlets near the cover of the device, in the case of a desktop computer, is that the inlets are less likely to be blocked accidentally by other items.

A computer may be initially provided with this housing with enhanced cooling, or a standard computer enclosure may be retro-fitted by addition of a partition with vent inside the standard enclosure so as to separate the enclosure into compartments

DETAILED DESCRIPTION OF THE INVENTION

Figure 1:
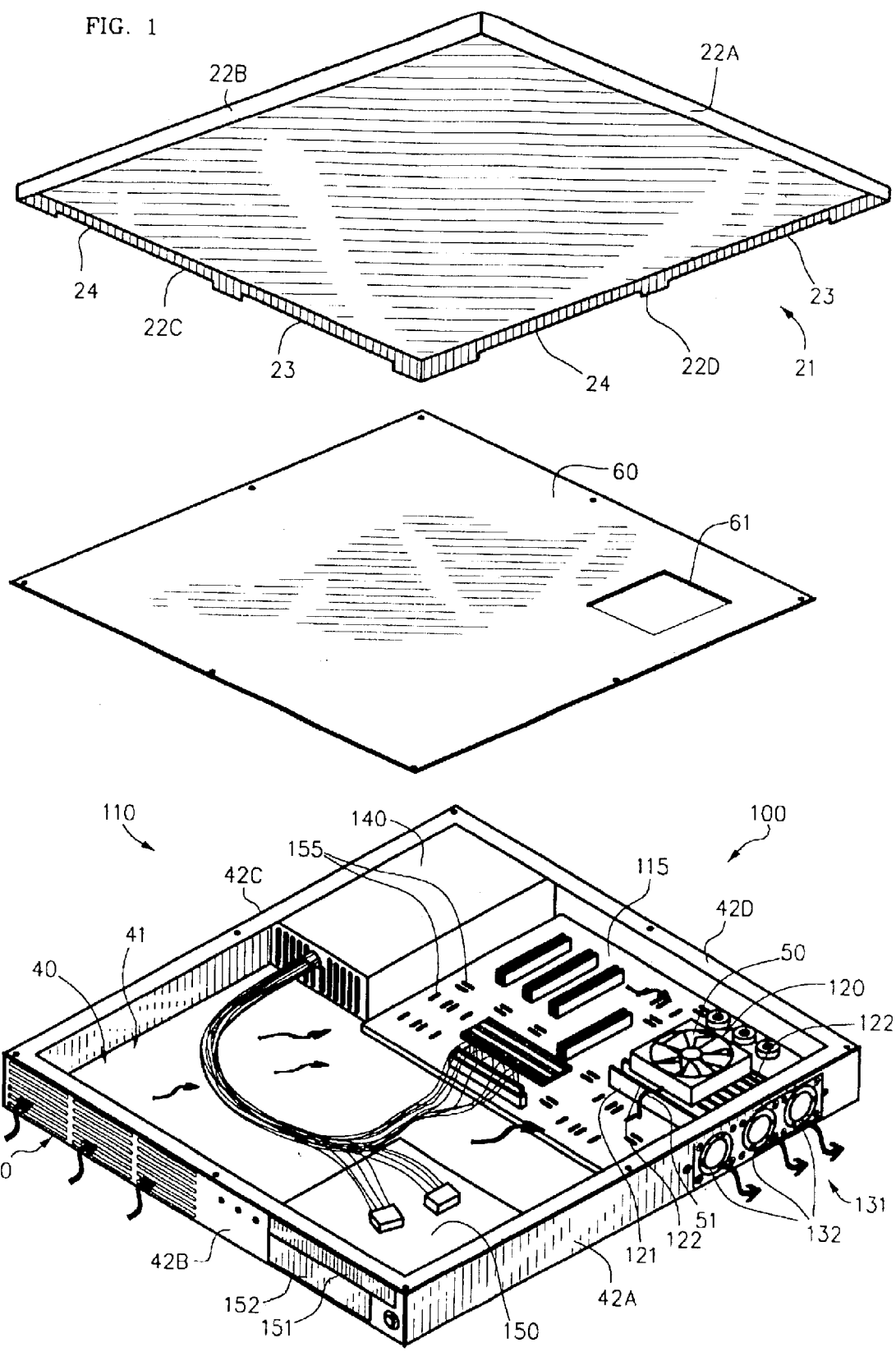
FIG. 1 is an exploded perspective view of the computer housing and directed air flow cooling system of the invention. Lower compartment 40 and partition 60 are seen from above; upper compartment 20 is seen to be in condition for allowance and allowance is requested from below.
Figure 7:
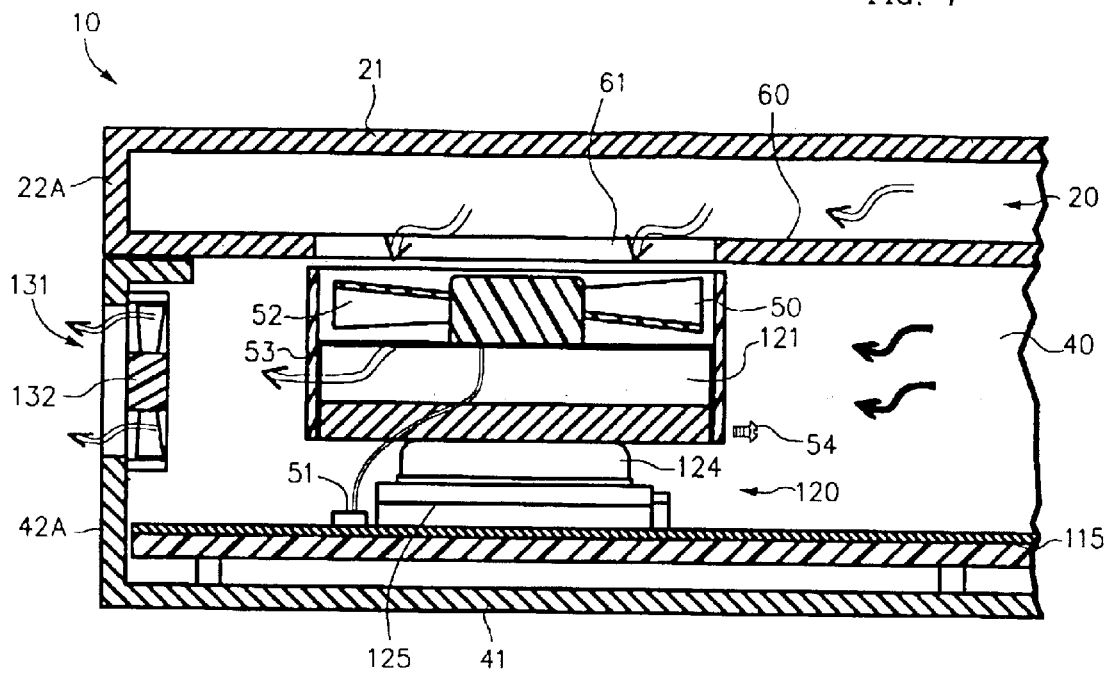
FIG. 7 is a partial sectional view taken on line 7—7 of FIG. 1 and inverted.

With reference now to the drawings, and more particularly to FIGS. 1 and 7 thereof, there is shown a housing 10 for an electronic device 100, such as rack-mountable computer 110. FIG. 1 is an exploded perspective view of computer housing 10 and directed air flow cooling system of the invention. FIG. 7 is a partial sectional view taken on line 7—7 of FIG. 1.

Computer 110 includes many heat-generating components 155, such as resistors, capacitors, and memory chips, and at least one heat-sensitive component, such as CPU 120, mounted upon a circuit board 115. Computer 110 also includes a power supply 140, which has its own cooling fan 141 (seen in FIG. 4), and an input/output device such as CD-ROM drive 150 accessible to the user through access door 151. A hard disk memory is mounted behind panel 152 and underneath CD-ROM drive 150.

The components of computer 110 are mounted in lower compartment 40 of housing 10. Lower compartment 40 includes floor 41, which supports circuit board 115 and other components of computer 110, and lower sidewalls 42 attached to the edges of floor 41 and extending upward to define lower compartment 40. In the preferred embodiment illustrated in FIG. 1, lower compartment 40 includes four lower sidewalls: first lower sidewall 42A, second lower sidewall 42B, third lower sidewall 42C, and fourth lower sidewall 42D, which are attached to floor 41 and to each other to define a rectangular lower compartment 40.

In the preferred embodiment illustrated in FIG. 1, lower compartment 40 includes the elements of conventional air cooling: an air intake grille 130 and exhaust fans 132 mounted vertically within exhaust outlet 131. Fans 132 draw warm air from inside lower compartment 40, causing cool ambient air to flow into air intake grille 130. To minimize recirculation of warm air, exhaust outlet 131 is located toward the real of first lower sidewall 42A and air intake grille 130 is located diagonally opposite on the left end of lower second sidewall 42B.

In the preferred embodiment shown in the drawings, airflow in the conventional cooling system is from air intake grille 130 to exhaust outlet 131 and is indicated figuratively by black arrows. As can be seen in FIG. 1, cooling air passes over heat-generating components 155 before reaching heat-sensitive CPU 120. Because the air has been warmed by heat-generating components 155, it has less capacity to cool CPU 120. CPU 120 may thus overheat and malfunction.

In a conventional computer housing, lower compartment 40 would be covered by a solid panel (not shown), such as a metal sheet. In the case of computer housing 10 and directed air flow cooling system of the present invention, lower compartment 40 is covered by partition 60, which includes vent opening 61. When partition 60 is in place upon lower compartment 40, vent opening 61 is located directly above CPU 120.

Partition 60 is covered by cover 21. Upper sidewalls 22 are attached to the edges of cover 21 and extend downward, defining an upper compartment 20. Partition 60 generally separates upper compartment 20 from lower compartment 40, with communication through vent opening 61.

Upper compartment 20 includes four upper sidewalls 22 in the preferred embodiment depicted: first upper sidewall 22A, second upper sidewall 22B, third upper sidewall 22C, and fourth upper sidewall 22D, which are attached to cover 21 and to each other to define a rectangular upper compartment 20.

At least one upper sidewall 22, such as third upper sidewall 22C, includes one or more air inlets 23, such as slots 24, for receiving ambient air into upper compartment 20. To avoid recirculation of warm air that has been exhausted from exhaust outlet 131, it is generally preferred that first upper sidewall 22A not include slots 24.

Partition 60, if used without a cover 21, would not provide sufficient environmental and mechanical protection to computer 110. A liquid spilled above partition 60 could penetrate into housing 10. Cover 21 and slots 24 allow air to pass easily to vent opening 61, but prevent all but a forcefully sprayed liquid from entering lower compartment 40.

The action of conventional exhaust fans 132 located in exhaust opening 131 draws ambient air into upper compartment 20 via slots 24 and downward through vent opening 61, as indicated figuratively by white arrows in FIG. 7. The additional source of non-preheated air flowing over CPU 120 helps prevent CPU 120 from overheating. However, this additional flow is largely laminar in nature and may not contact CPU 120 fully before exiting through exhaust outlet 131.

To maximize the cooling efficiency of the auxiliary airflow, an impingement fan 50 directs the auxiliary cooling airflow from upper compartment 20 to impinge forcefully in a turbulent manner onto CPU 120. In the partial sectional view of FIG. 7, CPU 120 is depicted as including device package 124, mounted in a mount, such as socket 125 attached to circuit board 115. CPU 120 includes a heatsink 121, which is thermally conductive and is heated by CPU 120. Heatsink 121 includes fins 122 for radiating heat to the auxiliary airflow, indicated figuratively by white arrows, that flows around fins 122. Fins 122, seen in side view in FIG. 7, generally comprise a plurality of thin, elongate members of thermally conductive material, such as copper, with channels between individual fins for passage of cooling air.

In FIG. 7, impingement fan 50 is shown mounted above fins 122 of heatsink 121. Impingement fan 50 includes impellers 52 and shroud 53. Impingement fan 50 is mounted above fins 122 by means of a screw 54 attaching shroud 53 to heatsink 121. Impingement fan 50 draws cooling air from upper compartment 20 and forces it turbulently against fins 122. After contacting fins 122 and cooling them, the auxiliary airflow joins with the conventional cooling airflow and exits lower compartment 40 via exhaust outlet 131.

Impingement fan 50 is powered by fan activation means 51. Fan activation means 51 is a circuit that includes a thermocouple (not shown) that closes the circuit to activate impingement fan 50 when the temperature in the vicinity of CPU 120 exceeds a pre-set value. Alternatively, impingement fan 50 may be designed so as to be activated whenever computer 110 is operating.

Figure 2:
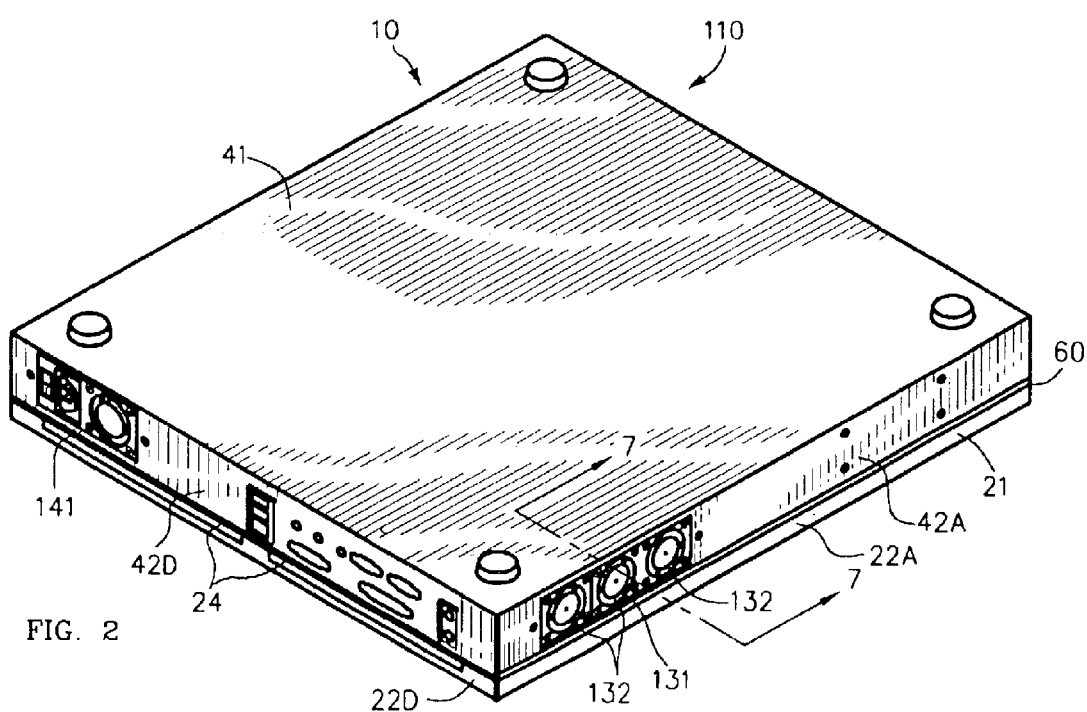
FIG. 2 is a right side, rear, bottom perspective view thereof.
Figure 3:
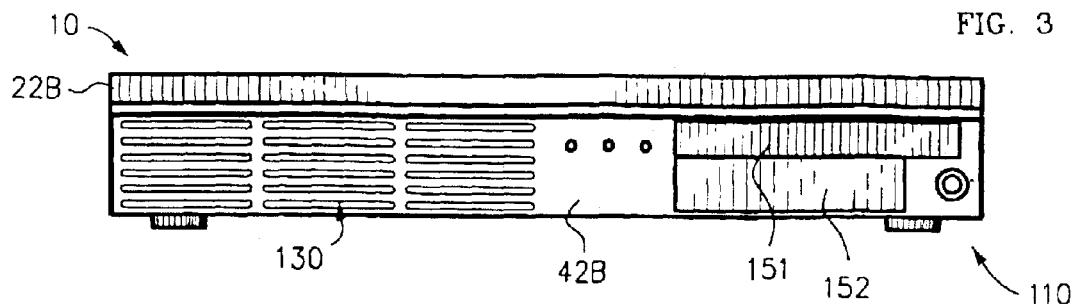
FIG. 3 is a front elevation view thereof.
Figure 4:
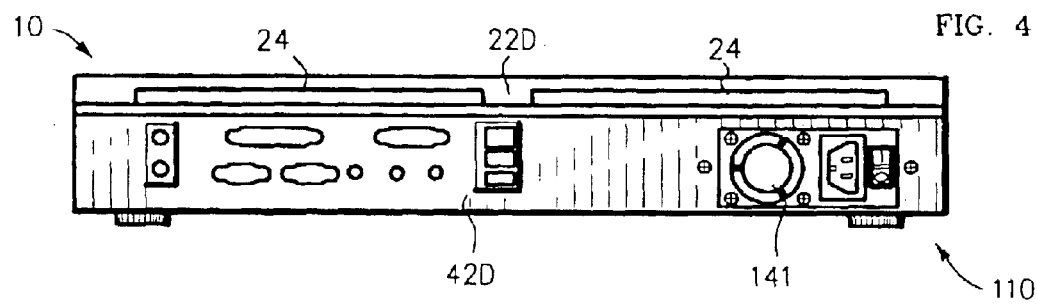
FIG. 4 is a rear elevation view thereof.
Figure 5:
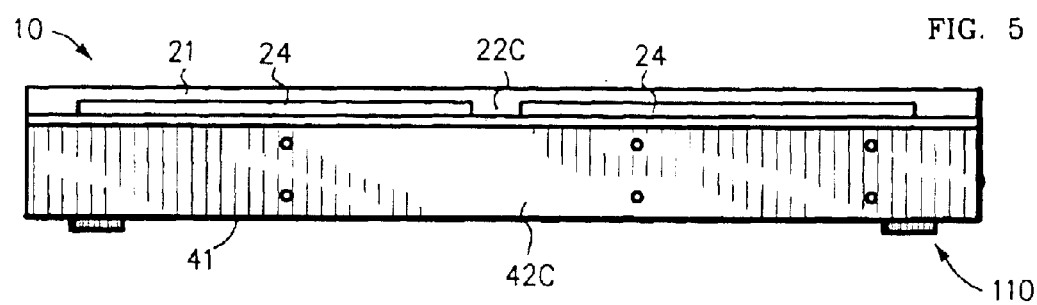
FIG. 5 is a left side view thereof.
Figure 6:
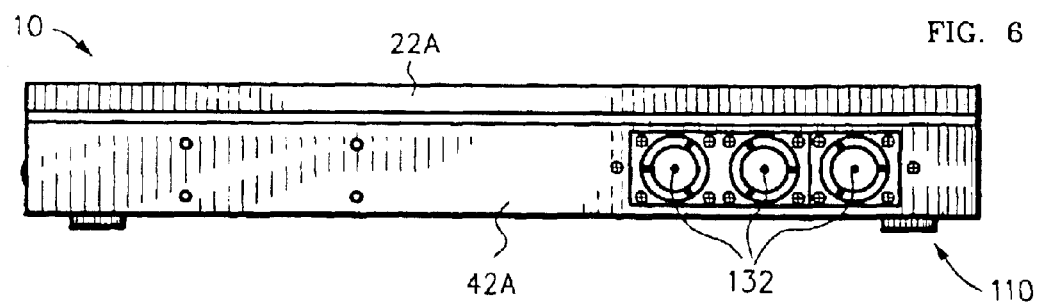
FIG. 6 is a right side view thereof.

FIG. 2 is a right side, rear, bottom perspective view of housing 10 for computer 110. FIG. 3 is a front elevation view of housing 10. FIG. 4 is a rear elevation view of housing 10. FIG. 5 is a left side view of housing 10. FIG. 6 is a right side view of housing 10.

Having described the preferred embodiment of the invention, many alterations and modifications which are within the inventive concepts disclosed herein will likely occur to those skilled in the art.

For example, impingement fan 50 may be mounted elsewhere than above heatsink 121. Alternatively, impingement fan 50 may be mounted within vent opening 61 such that auxiliary airflow is directed downward onto heatsink 121. Alternatively, impingement fan 50 may be mounted on the inner face of cover 21 such that airflow is directed downward through vent opening 61.

Housing 10 may be of various shapes, such as will be appropriate for containing an electronic device 100 or for being mounted in a rack (not shown) of a given size. The outside shape may be rectangular, square, or any other appropriate shape. As noted above, air indict(s) 23 may be located at various points on upper sidewalls 22, but it is generally preferred that air inlet(s) 23 be located far enough from exhaust outlet 131 that warm air is not recirculated into housing 10.

Alternatively to the embodiment illustrated, housing 10 may be designed without air intake grille 130, such that all cooling airflow is received through air inlet(s) 23 and delivered to lower compartment 40 through vent opening 61, particularly if there is only one heat-sensitive component 120.

Therefore, it is to be understood that all matter herein is to be interpreted as illustrative and not in any limiting sense, and it is intended to cover in the appended claims such modifications as come within the true spirit and scope of the invention.

I claim:

1. A housing for an electronic device that includes a plurality of components, at least one being a heat-generating component and at least one being a heat-sensitive component; said housing including:
    a partition separating said housing into two compartments; said compartments comprising:
        a lower compartment for enclosing the heat-generating and heat-sensitive components; including:
            an air intake grille for receiving ambient air into said lower compartment;
            a floor for supporting components of the electronic device; and
            side walls connected to the edges of said floor and extending upward; including:
                an exhaust outlet for allowing hot air to flow out of said lower compartment; including an exhaust fan for directing warm air out of said exhaust outlet; wherein said plurality of heat-generating components are between said air intake grille and said exhaust outlet and an upper compartment for receiving ambient air; including
a cover;
side walls connected to the edges of said cover and extending downward; including:
an air inlet for admitting ambient air into said upper compartment; and
an impingement fan; and wherein said partition includes a vent opening located near the heat-sensitive component for allowing cool air to flow from said upper compartment onto the heat-sensitive component; and said impingement fan impels cool air to move through said vent opening toward said heat-sensitive component.

2. The housing of claim 1, wherein said fan is attached to the top of the heat-sensitive component and pulls air downward onto the heat-sensitive component.

3. The housing of claim 2, further including fan activation means for activating said fan when the temperature of heat-sensitive component exceeds a pre-set value.

4. The housing of claim 1, wherein both said compartments include four side walls and are rectangular in shape; and wherein said air inlet for admitting ambient air into said upper compartment comprises a plurality of openings spaced apart on said side wall that is opposite the side wall that includes said vent outlet.

5. In combination:
an electronic device including:
a plurality of heat-generating components; and
a heat-sensitive component; and
a housing for said electronic device; including:
a lower compartment for enclosing said plurality of heat-generating components; including:
a floor;
a first side wall; including
an exhaust outlet for allowing hot air to flow out of said enclosure;
a second side wall;
a third side wall; and
a fourth side wall; said side walls connected to each other and extending upward from the perimeter of said floor so as to define a rectangular, open-topped box;
an upper compartment for receiving ambient air; including:
a cover,
a first side wall;
a second side wall;
a third side wall; and
a fourth side wall; said side walls connected to each other and extending downward from the perimeter of said cover so as to define a rectangular, open-bottomed box; at least one of said side walls including:
an air inlet for admitting ambient air into said upper compartment; and
a partition separating said lower compartment from said upper compartment; including:
a vent opening located near said heat-sensitive component for allowing cool air to flow from said upper compartment onto said heat-sensitive component; and:
an impingement fan for directing cooling air from said upper compartment onto said heat-sensitive component.

6. The combination of claim 5, said lower compartment further including an air intake grille for receiving ambient air into said lower compartment; and said exhaust outlet including an exhaust fan for directing warm air out of said exhaust outlet; and wherein said plurality of heat-generating components are between said air intake grille and said exhaust outlet.

7. An electronic device including:
walls defining an enclosure including:
a floor;
a cover; and
side walls; and
a partition between said top wall and said bottom wall dividing said enclosure into lower and upper compartments;
a plurality of heat generating electric components mounted in said lower compartment of said enclosure including:
a heat sensitive processing unit;
a heatsink mounted on said processing unit;
a main cooling system comprising:
an air intake grille in one said side wall for entry of air into said lower compartment;
a first exhaust outlet in one said side wall for outlet of air from said lower compartment;
a first fan connected to said enclosure for moving air from said air intake grille, past said plurality of electric components, and to said exhaust outlet so as to cool said electronic components; and
an auxiliary cooling system comprising:
an air inlet in one said side wall for entry of air into said upper compartment;
a vent opening in said partition for exit of air from said upper compartment substantially directly on said heatsink;
a second fan mounted in said enclosure for moving air from said air inlet of said auxiliary cooling system, through said vent opening of said auxiliary cooling system, and onto said heatsink.

8. The electronic device of claim 7, wherein said air inlet is in one said side wall opposite said exhaust outlet.

9. The electronic device of claim 8, wherein said second fan is mounted on said heatsink.

10. The electronic device of claim 9, further including:
fan activation means for activating said second fan when the temperature of said heat sensitive processing unit exceeds a pre-set value.

11. The electronic device of claim 7 wherein said second fan is mounted on said heatsink.

12. The electronic device of claim 11 further including:
fan activation means for activating said second fan when the temperature of said heat sensitive processing unit exceeds a pre-set value.

\* \* \* \* \*